United States Patent [19]

Gutt et al.

[11] Patent Number: 5,057,441

[45] Date of Patent: Oct. 15, 1991

[54] METHOD FOR RELIABILITY TESTING INTEGRATED CIRCUIT METAL FILMS

[75] Inventors: Gregory M. Gutt, Cupertino, Calif.; Avid Kamgar, Bernardsville, N.J.; Robert V. Knoell, Dearborn Heights, Mich.; Ronald J. Schutz, Warren, N.J.

[73] Assignee: AT&T Bell Laboratories, Murray Hill, N.J.

[21] Appl. No.: 605,043

[22] Filed: Oct. 29, 1990

[51] Int. Cl.[5] ............................................. H01L 21/78
[52] U.S. Cl. ........................................ 437/8; 324/719
[58] Field of Search ................... 437/8; 324/614, 657, 324/693, 707, 719

[56] References Cited

PUBLICATIONS

Applied Physics Letters, vol. 23, No. 6, 1973, "Screening of Metal Film Defects by Current Noise Measurements," by J. L. Vossen, pp. 287-289.

Physical Review B, vol. 31, No. 2, 1985, "Direct Link Between 1/f Noise and Defects in Metal Films," by D. M. Fleetwood and N. Giordano, pp. 1157-1159.

IEEE International Reliability Physics Symposium, 1988, "A Comparison Between Noise Measurements and Conventional Electromigration Reliability Testing," by J. G. Cottle and T. M. Chen and K. P. Rodbell, pp. 203-208.

IEEE Computer Society Test Technology Committee Curriculum For Test Technology, 1983, "Noise Measurement as a Testing Tool," by Andrzej Peczalski, pp. 37-40.

Solid State Electronics, vol. 32, No. 1, "A Study of Electromigration in Aluminum and Aluminum-Silicon Thin Film Resistors Using Noise Technique," by A. Diligenti, P. E. Bagnoli, B. Neri, S. Bea and L. Mantellassi, pp. 11-16, (1989).

IEEE Transactions on Electron Devices, ED-34, 1987, "Electromigration and Low-Frequency Resistance Fluctuations in Aluminum Thin-Film Interconnections," by Bruno Neri, Alessandro Deligenti, and Paolo Emilio Bagnoli, pp. 2317-2321.

Rev. Sci. Instrum., vol. 58, 1987, "AC Method for Measuring Low-Frequency Resistance Fluctuation Spectra," by John H. Scofield, pp. 985-993.

Primary Examiner—Olik Chaudhuri
Assistant Examiner—David E. Graybill
Attorney, Agent, or Firm—M. I. Finston; E. E. Pacher

[57] ABSTRACT

Disclosed is a method for manufacturing an integrated circuit which includes the step of evaluating the reliability of metal films in the circuit using a noise measurement technique. In one embodiment, a film portion to be tested is incorporated in a Wheatstone bridge. A relatively large direct current is passed through the film to stimulate $1/f^2$ noise. A relatively small alternating current is concurrently passed through the film. The bridge imbalance signal at the ac frequency is amplified and demodulated by a phase-locked amplifier, and is then frequency analyzed. The film is evaluated by comparing the resulting noise power spectrum with predetermined standards.

5 Claims, 2 Drawing Sheets

METHOD FOR RELIABILITY TESTING INTEGRATED CIRCUIT METAL FILMS

TECHNICAL FIELD

This invention pertains to methods for the manufacture of integrated circuits, and in particular to methods including the reliability testing of metal films that are included in such circuits.

BACKGROUND OF THE INVENTION

Electromigration is the mass transport of ions along a metal conductor as a result of a large electron current density in the conductor and is generally an undesirable phenomenon. The typical mechanism for electromigration damage to metallization lines in integrated circuits (ICs) is believed to be a two-stage process. In the first stage, it has been proposed that mass transport of conductor atoms results in the thinning of the conductor in some areas (for example, void formation), and the thickening of the conductor in other areas (for example, hillock formation). In the second stage, either the voids grow large enough to interrupt the flow of current, causing an open cicuit, or the hillocks grow out toward a neighboring metallization line, causing a short circuit. The consequence, in either case, is failure of the IC. Although electromigration damage leading to IC failure may generally be avoided by adherence to design rules limiting the current density in metallization lines to a prescribed value, such design rules are in at least some cases inconsistent with the requirements of VLSI circuit design. That is, because VLSI circuits have very small metallization cross sections, large current densities leading to electromigration damage can occur even for the relatively small currents typical of the operation of a VLSI circuit. As a consequence, electromigration is of great concern in assessing the reliability of ICs, and particularly VLSI circuits.

Conventionally, the reliability of a metallization line in an IC is evaluated by, e.g., a Median Time to Failure (MTF) test. That is, a large number of identically prepared thin film metallization lines are stressed to failure at an elevated temperature and current density. The time taken for half of the lines in the sample to fail gives a reliable indication of the propensity of similar lines to fail by electromigration. However, MTF testing can take days, or even weeks, to complete. During the testing period, the processing and packaging of ICs typically continues. As a consequence, if testing should reveal a problem in a particular manufacturing line, the inventory already processed in that line may be lost.

Although accelerated tests such as TRACE (Temperature Ramp Resistance Analysis to Characterize Electromigration) are available, which subject the sample to relatively high stresses, such tests provide little insight into the long term failure properties of thin metal films such as those used for IC metallization.

In at least some cases, by contrast, reliability with respect to electromigration can be assessed relatively quickly and non-destructively by means of tests based on noise measurement. That is, strong correlations are known to exist between the level and character of noise in thin metal films and the reliability of the films. (See, for example, J. L. Vossen, *Applied Physics Letters*, Vol. 23, pp. 287-289 (1973), and D. M. Fleetwood and N. Giordano, *Physical Review B*, Vol. 31, pp. 1157-1159 (1985).) In particular, the occurrence of electromigration and stress voiding in thin aluminum films subjected to high current densities has been correlated with a noise power spectral density (commonly referred to as the "noise power spectrum") having a $1/f^2$ dependence, where f represents frequency. Suppose a noise voltage associated with the current flow through a metal film having a finite resistance is measured and let $S_{1/f^2}$ denote that component of the noise spectrum that is due to $1/f^2$ noise. It has been shown that $S_{1/f^2}$ depends upon temperatures through a term of the form $e^{-E_2/kT}$, where $E_2$ is an activation energy, k is Boltzmann's constant, and T represents temperature. Similarly, the time required for half the samples in an MTF test to fail is typically described by a formula, known as Black's formula, which depends upon temperature through a term of the form $e^{-E_a/kT}$, where $E_a$ is also an activation energy. Significantly, the respective activation energies of the noise power spectrum and the MTF have been shown to be approximately the same for pure aluminum films. This correspondence, and the potential usefulness of noise measurements to determine the reliability of metallization lines in ICs, are discussed, for example, in J. G. Cottle, T. M. Chen, and K. P. Rodell, *IEEE International Reliability Physics Symposium*, pp. 203-208, (1988). Further discussions of the potential usefulness of noise measurements are found in A. Peczalski, *IEEE Computer Society Test Technology Committee Curriculum for Test Technology*, pp. 37-40, (1983), and A. Diligenti, P. E. Bagnoli, B. Neri, S. Bea and L. Mantellassi, *Solid State Electronics*, Vol. 32, No. 1, pp. 11-16, (1989).

However, the use of conventional noise-measurement techniques for assessing electromigration in thin metal films has generally been limited to packaged ICs and test structures using low-noise bonded contacts, in order to avoid measurement error caused by contact noise and mechanical vibrations. Although these techniques can provide useful information on the nature of electromigration in thin metal films, they are not a significant aid in an integrated circuit manufacturing environment, since these techniques would test for conductor reliability only after the manufacture of at least one IC is complete, i.e., after the IC is packaged.

By contrast, measurements performed in the manufacturing environment by the direct application of electrical probes to wafers are typically prone to errors caused by background noise, including contact noise and mechanical vibrations. Some reduction of background noise potentially is afforded by incorporating the film to be measured as one of the resistances making up a Wheatstone bridge. Resistance measurements using such an arrangement are insensitive to fluctuations in the source voltage, although other contributions to the background noise may still be significant. A direct current, Wheatstone bridge method was described, for example, by B. Neri, et al., "Electromigration and Low-Frequency Resistance Fluctuations in Aluminum Thin-Film Interconnections," *IEEE Transactions on Electron Devices*, ED-34 pp. 2317-2321 (1987). However, Neri reported the use of additional techniques for the exclusion of background noise, including placing the measurement system on an antivibrating bench and enclosing it in a shielded room. Such measures would be difficult to implement in the manufacturing environment.

A particularly useful Wheatstone bridge method is described by J. H. Scofield, "AC Method for Measuring Low-Frequency Resistance Fluctuation Spectra," *Rev. Sci. Instrum.*, Vol. 58, pp. 985-993 (1987). The Scofield method makes use of a center-tapped four-point probe for contacting the sample. That is, the sample resistance is divided into two equal portions by the center tap of the probe. Thus, the sample comprises not one, but two arms of a Wheatstone bridge. As in the case of a conventional bridge, two or more resistors (which comprise at least one ballast resistor and at least one measuring resistor) are connected in series with the sample, and the voltage source, which applies a voltage signal having an ac component, is connected between the center tap and a point intermediate the two ballast resistors. The ac component of the bridge imbalance signal appearing across a portion of the sample is amplified and demodulated by a phase sensitive amplifier. Like other bridge techniques, this measurement technique is relatively insensitive to fluctuations in the source voltage. Moreover, because the measurement technique is an ac technique, the amplifier can be used near its optimum frequency, and the use of phase sensitive detection is very effective in excluding background noise.

Scofield discusses the use of this technique for measuring resistance fluctuations in metal films. Scofield also mentions that for certain purposes it may be useful to apply a source voltage having both ac and dc components. Scofield does not, however, discuss any application of this technique for investigating phenomena related to electromigration, and in particular, he does not suggest the use of the dc component for stimulating electromigration. Moreover, the metal film samples discussed by Scofield were wirebonded to a 24-pin IC package prior to the measurements. However, the steps involved in wirebonding introduce a significant time delay between preparation of the films and their measurement. Such delay may be undesirable in applications of the measurement technique for the diagnosis of processes on an IC production line.

Thus, practitioners in the field have not yet achieved a quick, accurate reliability test based on the noise-measurement technique that avoids measurement errors due to mechanical and contact noise and can therefore be implemented on an integrated circuit manufacturing line. If achieved, such a testing method could reduce manufacturing time and expense. This application discloses such a testing method.

SUMMARY OF THE INVENTION

The invention is a method for manufacturing an integrated circuit which includes the steps of providing one or more semiconductor substrates (here referred to as "wafers") to be processed, and processing them. During the processing, a patterned metallic film including at least one strip-like test portion is formed on each of at least some of the substrates. The test portions are formed in addition to, or (on selected wafers) in place of, the metallized regions that are intended to be incorporated in ICs. The method further includes the step of evaluating a film test portion on at least one of the substrates relative to predetermined standards. If the result of the evaluation so indicates, the method further includes adjusting one or more process parameters such that subsequently processed substrates include film test portions conforming to the predetermined standards. The method optionally further includes performing one or more additional steps toward formation of the integrated circuit. The evaluating step comprises: causing a direct current and an alternating current to flow in the test portion, the combined currents being of sufficient magnitude to stimulate $1/f^2$ noise in the test portion; determining the noise spectrum associated with the alternating current; and comparing the slope and amplitude of the spectrum with predetermined values at one or more preselected frequencies.

In a preferred embodiment, each test portion is appropriately patterned for incorporation in a Wheatstone bridge by means of a center-tapped four-point probe apparatus, as described, for example, in Scofield, cited above. In such a case, each test portion to be incorporated includes five contact regions (sometimes referred to as "contact pads"). Correspondingly, five point contacts are provided on the probe, each of which is to be applied to one of the five contact pads.

During the evaluating step, a signal is applied to the bridge, typically consisting of a dc current component of relatively large amplitude, to which an ac current component of relatively small amplitude is added. The dc component stimulates electromigration in the sample, whereas the ac component is preferably made small enough to have negligible effect on electromigration. The ac component of the voltage drop across the sample film is modulated by resistance fluctuations in the sample. The modulation appears in an imbalance signal across the output terminals of the bridge. The imbalance signal is amplified, demodulated, and detected using a phase sensitive amplifier such as a lock-in amplifier. The output of the phase sensitive amplifier represents the noise signal. The noise signal is processed by a spectrum analyzer to produce a noise power spectrum.

BRIEF DESCRIPTION OF THE DRAWING(S)

DETAILED DESCRIPTION

According to a preferred embodiment of the inventive method, at least one IC is conventionally fabricated on each of one or more wafers, typically semiconductor wafers or wafers of other suitable substrate material for semiconductor-based electronic components. In addition to at least one IC, at least one test structure is also formed on at least one of the wafers. In a typical IC fabrication process, a multiplicity of ICs are formed in a rectangular grid pattern on the surface of a wafer. The test structure or structures are formed on portions of the wafer that are not occupied by ICs. It is preferable to form test structures within the grid pattern, in the spaces (i.e., the "kerf" areas) between ICs. Each test structure comprises a metal film patterned to accommodate the contact points of a probing apparatus that makes electrical contact with the test structure by the application of pressure between the contact points and the test structure. Enough pressure is typically exerted between the probe and the sample (i.e., the metal film) to leave a mark (referred to as a "footprint") on the sample at each point of contact. Preferably, the test structure is patterned to provide five pads for contact with a center-tapped four-point probe. Each pad is exemplarily a square having an edge length of 75-100 μm.

At a predetermined point in the manufacturing process, typically after lithographically patterning at least one layer of metal on each of a batch of wafers but before dicing the wafers to form individual ICs, one or more wafers are selected for reliability testing. The results of such testing are useful for setting the parameters of the metallization process being performed in the relevant manufacturing line.

One parameter of the metallization process that is capable of affecting reliability is the deposition temperature, because, for example, the deposition temperature affects grain size, as is well known in the art. Another such parameter is the residual gas pressure in the deposition chamber because, for example, residual oxygen that may be present may migrate to the grain boundaries and weaken them. Yet another parameter is the purity of the metal target that is the source of the metal being deposited. Additionally, certain characteristics of the lithographic process by which the metal layer is patterned are capable of affecting reliability. For example, when chlorine is used as a reactive-ion etchant, chlorine residues can lead to corrosion of the metal film. Thus, for example, measures designed to decrease or eliminate corrosive residues can be taken in response to the results of reliability testing.

Figure 1:
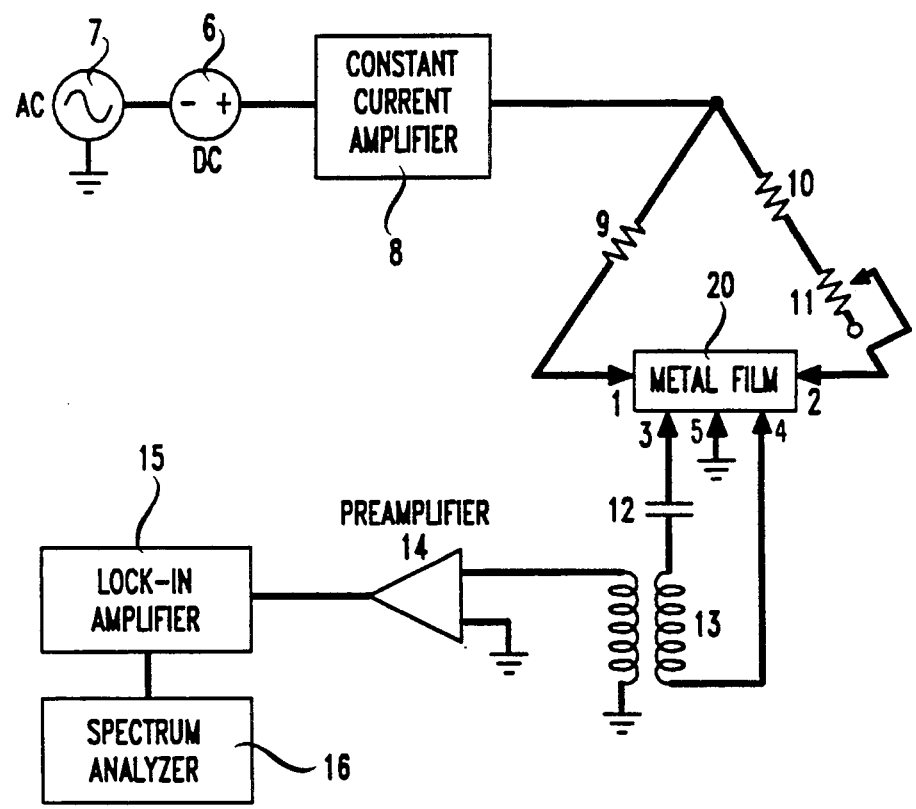
FIG. 1 is a schematic block diagram of an exemplary test configuration for practicing the inventive method.

Depicted schematically in FIG. 1 is a currently preferred configuration for performing the reliability test according to the invention. Metal film 20, to be tested, is formed on a processed wafer (not shown), typically having one or more ICs also formed on it. Film 20 is typically an aluminum film, exemplarily 0.2–1.5 $\mu$m thick, 0.3–3.0 $\mu$m wide, and 10–1000 $\mu$m long, has a typical resistivity (at 0.5 $\mu$m thickness) of about 0.04 $\Omega$ per square, and has a typical total resistance of 5–50 $\Omega$. A center-tapped four-point probe is electrically connected to the film by exerting pressure between the film and point contacts 1, 2, 3, 4, and 5 of the probe. The point contacts are exemplarily sharpened to a diameter of 20–40 $\mu$m at the tip, and are exemplarily spaced with a pitch that is twice the edge length of a contact pad. Point contact 5 is electrically connected to ground via a connection external to the film. Point contacts 1 and 2, located at opposite ends of the film, connect the film to the output terminal of constant current amplifier 8 via a resistive network comprising resistors 9, 10, and 11. That is, the film, as viewed in the figure, is divided into a left half and a right half by point contact 5. Electric current flows from amplifier 8 through resistor 9, and into the left half of film 20 via point contact 1, and returns to amplifier 8 through ground via point contact 5. Electric current flows from amplifier 8 through resistors 10 and 11, and into the right half of film 20 via point contact 2, and also returns to amplifier 8 through ground via point contact 5. The film, together with resistors 9, 10, and 11, thus forms a Wheatstone bridge connected across the output terminal and the ground terminal of amplifier 8. As viewed in the figure, the left arm of the bridge comprises resistor 9 and the left half of the film. The right arm of the bridge comprises resistors 10 and 11, and the right half of the film.

Exemplarily, resistors 9 and 10 are ballast resistors, each having a resistance of about 200 $\Omega$. To keep them at a constant temperature, they advantageously are heat-sinked and water-cooled. Resistor 11 is, exemplarily, a wire-wound variable resistor having a maximum resistance of about 100 $\Omega$. The maximum ac current flowing in the bridge is typically about 100 ma.

The output of amplifier 8 consists of a current that is proportional to the voltage signal applied between ground and the input terminal of the amplifier. The voltage signal is provided by dc voltage source 6 and ac voltage source 7 operating in series. The input voltage signal, and the output current, have stable waveforms and do not substantially contribute background noise (i.e., noise that is unrelated to electromigration or other processes inherent in the film to be tested) to the measurement system. The frequency of the ac voltage signal is selected to be within the optimum frequency range for amplification by preamplifier 14, and also relatively far from the frequencies characterizing mechanical vibrations in the manufacturing environment. In addition, for optimum noise exclusion, the ac frequency is desirably at least about ten times the highest frequency that is expected to make a significant contribution to the noise power spectrum associated with electromigration. A useful range of frequencies is 10 Hz–$10^3$ Hz. A preferred value for the ac frequency is about 200 Hz, which is about 20 times the highest frequency of interest in the noise spectrum, as explained below.

The frequencies associated with mechanical noise in the relevant manufacturing environment typically occupy the range from about 1 Hz to about 10 Hz. The frequencies of interest in the noise power spectrum obtained by the inventive method are also approximately in the range 1–10 Hz. That is, the time required for spectrum analyzer 16 to calculate the noise power associated with frequencies below about 1 Hz is undesirably long, and extending the spectrum into the range is of limited additional value. Therefore, noise power below about 1 Hz is not typically analyzed. As a practical matter, at frequencies above about 10 Hz, that component of the noise power that is due to electromigration generally tends to be buried in the thermal noise component. Therefore, noise power above about 10 Hz is also typically not analyzed.

Point contact 3 is electrically connected to the left half of the film at a point intermediate point contacts 1 and 5. Point contact 4 is electrically connected to the right half of the film at a point intermediate point contacts 2 and 5. Because the current in the resistive network has both an ac and a dc component, the voltage difference between point contacts 3 and 4 generally also has an ac and a dc component. The ac component of this voltage difference is inductively coupled, via isolation transformer 13, to preamplifier 14. Direct current is excluded from the transformer primary circuit by capacitor 12. The preamplified signal is fed to lock-in amplifier 15, which is frequency and phase locked to the signal. The lock-in amplifier amplifies and demodulates the ac signal, providing an output signal that is slowly varying relative to the ac frequency. This output signal is fed to spectrum analyzer 16, which exemplarily performs a fast Fourier transform on the signal to determine its spectral power density which is, for example, displayed as a function of frequency on a suitable output device. All these components can be conventional.

A conventional low-pass filter (not shown) having a cut-off at, for example, 20 Hz is optionally included in the measuring circuit at a point between lock-in amplifier 15 and spectrum analyzer 16.

As noted, the resistive network forms a Wheatstone bridge. By varying one or more of resistors 9, 10, and 11 (for example, by varying resistor 11, as depicted in the figure), the bridge can be nulled to an applied ac signal. That is, with alternating current flowing out of amplifier 8 and through the two sides of the bridge, the amplitude of the ac voltage drop between point contacts 3 and 4 is brought essentially to zero (except for relatively low-amplitude noise, to be discussed below).

Preferably, the bridge is nulled automatically. That is, the ac bridge imbalance voltage is amplified, for example, by preamplifier 14 and amplified and demodulated by lock-in amplifier 15, and the resulting dc signal is sensed at the output of the lock-in amplifier. Under the control of an appropriately programmed microprocessor, the resistance of resistor 11 is varied, and the phase of lock-in amplifier 15 is adjusted, to minimize the imbalance voltage. This procedure is repeated each time the sample is changed, and each time a measurement variable (such as temperature or bridge current) is changed.

When the bridge is nulled and an appropriately large dc current is flowing, most of the noise voltage appearing between point contacts 3 and 4 is caused by resistance fluctuations related to electromigration in the left and right sides of the film. When the current that is flowing has an ac component as well as the dc component, the voltage drop $v_{34}$ between point contacts 3 and 4 includes an ac component that is modulated by the same resistance fluctuations. (As noted, the alternating current preferably has a relatively small amplitude, such that it has essentially negligible effect on the electromigration process.) Information about electromigration is provided, as discussed above, by amplifying, demodulating, and spectrally analyzing the ac component of $v_{34}$.

It should be noted in this regard that the direct current in both sides of the film flows in the same sense relative to point contact 5. That is, it flows either towards, or away from, the contact in both sides. As a consequence, the ion flow due to electromigration is also in the same sense in both sides. (The ion flow is in the same direction as the electron flow, because electromigration is related to drag.)

Two aspects of this measurement technique, in particular, are effective in excluding background noise arising from sources external to the film (in distinction, e.g., to electromigration noise); they are the bridge geometry and the use of phase-sensitive detection. That is, the lock-in amplifier is effective for excluding noise arising as a result of mechanical vibration, because a signal frequency can be chosen that is far from any frequencies characteristic of mechanical vibrations in the manufacturing environment. The bridge is made relatively insensitive to contact noise by choosing values of the external resistors (i.e., resistors 9, 10, and 11) that are much greater than the contact resistance fluctuations associated with contact noise. Such a choice assures that the current flowing in the film will be relatively insensitive to the relatively small resistance fluctuations at point contacts 1 and 2. Moreover, the noise voltage $v_{34}$ is insensitive to contact noise at point contact 5 because contact noise at that point changes the voltages at contacts 3 and 4 in step such that their difference is essentially unaffected.

Figure 2:
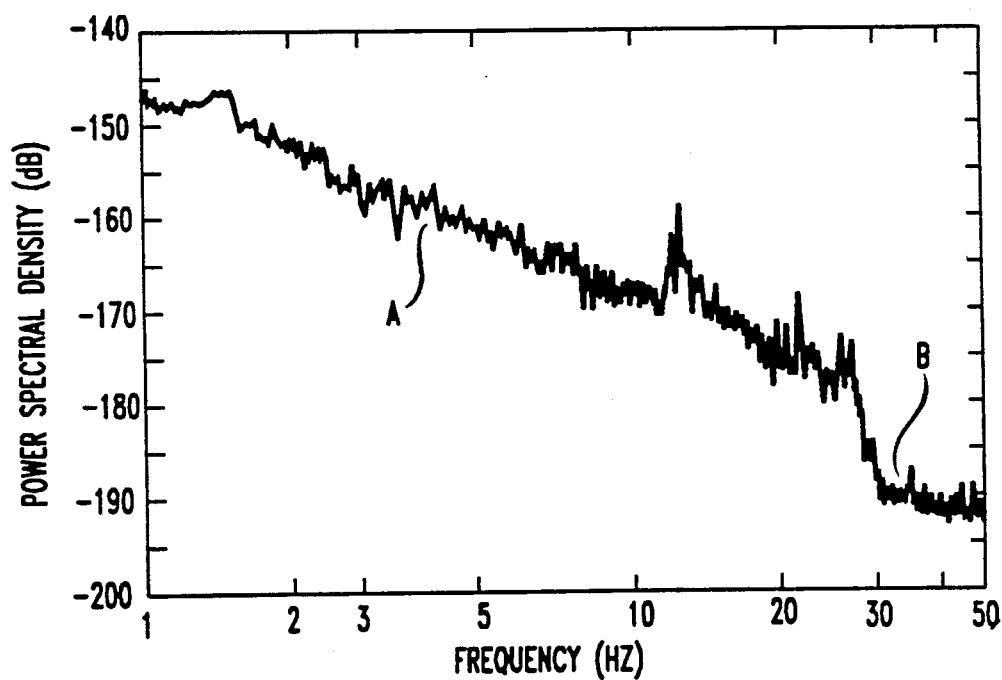
FIG. 2 is a typical noise power spectrum of a metal film to which a dc current is applied to stimulate electromigration.

The output of spectrum analyzer 16 is a noise power density spectrum, typically extending from about 1 Hz to about 10 Hz, as discussed above. With reference to FIG. 2, at a given temperature and electric current, the spectrum typically exhibits two portions, a low-frequency portion A and a high-frequency portion B, generally separated by a transition region. Portion A, corresponding to the frequency range where electromigration is the dominant source of noise, bears an inverse-square relation to the frequency. (That is, letting f represent frequency, the noise power spectral density is proportional to $f^{-\alpha}$, where $\alpha$ is approximately equal to 2.)

Portion B may be dominated by thermal noise (at least in a certain frequency range), which typically produces a noise power density spectrum that is relatively flat with respect to frequency. Portion B may also be dominated by 1/f noise (at least in a certain frequency range), or by a combination of 1/f and thermal noise. (It should be noted in this regard that the spectrum of FIG. 2 includes the effects of a low-pass filter having a cut-off at 20 Hz, included in the measuring circuit as discussed above. The low-pass filter caused a sharp roll-off to appear in the spectrum between 20 Hz and 30 Hz.)

Where, as in FIG. 2, the noise power spectrum is displayed on a log-log plot, portion A (and possibly also portion B) appears as an approximate straight line. The slope of portion A is $-\alpha$ (where $\alpha$ is equal to approximately 2), or (according to the manner of labeling the axes of FIG. 2) approximately 20 dB per decade.

The noise spectrum is readily compared with predetermined criteria in order to evaluate the reliability of the metal film (and by inference, the reliability of other metal films formed under substantially identical conditions). Such information can provide a basis for adjusting process parameters to improve the reliability of the metal films being formed, e.g., metal films that are to be incorporated in ICs. In addition, comparisons between spectra taken from films formed on multiple wafers processed in a single manufacturing line are useful for assessing the consistency of the film-forming process.

It should be noted in this regard that the criteria for determining the reliability of the metallization are at least partly dependent on the manufacturing line. That is, reliability depends, inter alia, on the composition of the metal film and its grain structure. Thus, for example, although IC metallization is conventionally aluminum based, various alloys of aluminum may be employed. Whereas some manufacturing lines use pure aluminum, others use alloys containing a few percent copper and/or silicon, while still others use aluminum alloys containing titanium or palladium for forming at least a portion of an IC metallization pattern. Furthermore, the grain structure of the film is itself dependent on process parameters. A film formed, for example, by a process producing relatively small grains may be more susceptible to electromigration damage than a film of the same composition formed by a process producing relatively large grains.

In general, a noise spectrum is evaluated, at a given temperature, with regard to three characteristics: the current density J, the slope $-\alpha$ within a selected frequency range, and the magnitude $S_f$ of the noise power spectral density at a specified frequency f (e.g., f=1 Hz, and $S_{1\,Hz}$ is consequently the 1-Hz intercept of the spectrum).

The emergence of a spectral portion having $\alpha$ near 2 at some threshold current density $J_\theta$ is an indication that electromigration contributes to film failure at current densities of at least $J_\theta$.

Figure 3:
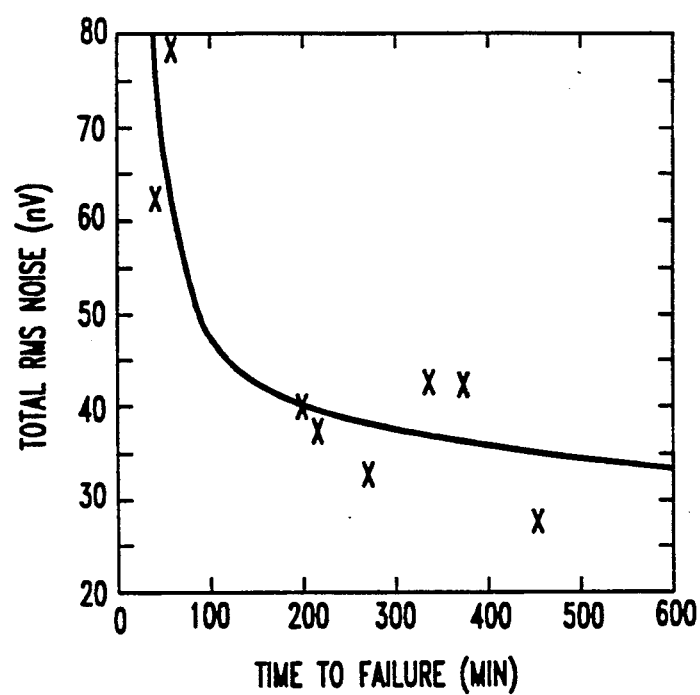
FIG. 3 is an exemplary graph, taken from the prior art, depicting a correlation between time to failure of metal films and noise in those films.

If the values of $\alpha$ and $J_\theta$ indicate that electromigration is a significant reliability factor for the contemplated applications of the films being tested, the $S_f$(e.g., $S_{1Hz}$) is readily compared with predetermined criteria. That is, the magnitude of the $1/f^2$ noise is readily correlated to the results of conventional reliability tests such as MTF tests (although, as noted, correlations are valid, in general, only for films of comparable compositions and grain structures). For example, Cottle and Chen (1987), cited above, presents a graphical plot of the total RMS noise in aluminum films against the time to failure of the films. That plot is reproduced here as FIG. 3.

The inventive testing method is readily applied at any point during the manufacture of an IC, provided a metal test pattern has been formed and is accessible to probes (i.e., it has not been removed or covered over). The method is preferably applied immediately after the patterning of a metallization layer (the patterned layer to include an appropriate test pattern). When the IC is to include multiple metallization layers, the inventive method is readily repeated for each such layer.

Other steps in the manufacture of the IC are conventional, and are readily apparent to the practitioner of ordinary skill. By way of illustration, such steps might include, after providing a substrate wafer, the steps of growing at least one oxide layer on the wafer, patterning at least one oxide layer, and doping selected portions of the substrate. As discussed, one or more metallized layers may be formed and patterned. After the forming and patterning of the various layers, the wafer may be divided into portions, each corresponding to an individual IC, electrical leads may be attached to the portions, and each portion may be encapsulated to form a packaged IC.

EXAMPLE

An aluminum film containing 0.5% copper was deposited on a silicon substrate. The film thickness was 0.5 $\mu$m, and the film was patterned into a strip 0.75 $\mu$m wide. The film was incorporated in a Wheatstone bridge by means of a center tapped, four-point probe, as described above. A current density of $3.4 \times 10^7$ A/cm$^2$ was passed through the film. The temperature of the film was uncontrolled, and the passage of current raised the film temperature to a maximum of about 45° C. The noise spectrum was measured by lock-in amplification and demodulation of the bridge imbalance signal followed by fast-Fourier-transform spectral analysis, as described above. The measured value of $\alpha$ was 2.08. The threshold current density at which $\alpha$ changed from about 1 to about 2 was observed to be about $1.5 \times 10^7$ A/cm$^2$. The rms noise voltage at 1 Hz was found to be about $4.6 \times 10^{-8}$ V.

We claim:

1. A method for manufacturing an integrated circuit which includes the steps of:
   providing one or more semiconductor substrates to be processed;
   processing the substrates, said processing step including the step of forming, on each of the substrates, a patterned metallic film, and associated with the processing step there being a multiplicity of process parameters;
   evaluating a film portion on at least one of the substrates relative to predetermined standards, and, if indicated by the result of the evaluation, adjusting one or more process parameters such that subsequently processed substrates include film portions conforming to the predetermined standards; and
   optionally performing one or more additional steps toward formation of the integrated circuit,
   characterized in that:
   a) the film portion comprises a strip-like test portion;
   b) the evaluating step comprises the steps of:
      i) causing to flow, in the test portion, a direct current and an alternating current, the combined currents being of sufficient magnitude to stimulate 1/f$^2$ noise in the test portion; and
      ii) determining the noise spectrum associated with the alternating current; and
   c) the evaluating step further comprises comparing the slope and amplitude of the spectrum with predetermined values at one or more preselected frequencies.

2. The method of claim 1, further comprising the steps of:
   a) dividing at least one substrate into subdivisions such that at least one of the subdivisions incorporates an IC; and
   b) packaging at least one IC-incorporating subdivision;
   and wherein the evaluating step is performed prior to the dividing and packaging steps.

3. The method of claim 1, wherein said alternating current is weak enough such that essentially all of the stimulated 1/f$^2$ noise is due to the direct current.

4. The method of claim 1, further including the step of incorporating the test portion in a Wheatstone bridge such that, during at least a portion of the current-flowing step, an ac bridge-imbalance voltage can be detected between a predetermined pair of points on the test portion, and wherein the noise-spectrum-determining step comprises the steps of detecting the ac imbalance voltage with a phase-sensitive detector such that a demodulated voltage signal is produced, and processing the demodulated voltage signal with a spectrum analyzer.

5. The method of claim 4, wherein the step of incorporating the test portion in a Wheatstone bridge comprises:
   a) providing a center-tapped four-point probe electrically connected to two arms of a Wheatstone bridge, the probe having five point contacts; and
   b) pressing the five point contacts against the test portion such that each point contact is electrically connected to the test portion.

* * * * *